United States Patent
Lee et al.

(10) Patent No.: US 10,642,597 B2
(45) Date of Patent: May 5, 2020

(54) INTEGRATED MANAGEMENT AND UPDATE METHOD OF DC-DC CONVERTER AND BATTERY MANAGEMENT SYSTEM (BMS) SOFTWARE INSTALLED IN RESIDENTIAL ESS

(71) Applicant: LG Chem, Ltd., Seoul (KR)

(72) Inventors: Nak Choon Lee, Daejeon (KR); Kyu Hyok Yim, Daejeon (KR); Seong Keun Lee, Daejeon (KR)

(73) Assignee: LG Chem, Ltd. (KR)

( * ) Notice: Subject to any disclaimer, the term of this patent is extended or adjusted under 35 U.S.C. 154(b) by 0 days.

(21) Appl. No.: 15/812,115

(22) Filed: Nov. 14, 2017

(65) Prior Publication Data
US 2018/0157483 A1  Jun. 7, 2018

(30) Foreign Application Priority Data
Dec. 6, 2016 (KR) .................. 10-2016-0165026

(51) Int. Cl.
| | |
|---|---|
| *G06F 8/65* | (2018.01) |
| *G06F 8/71* | (2018.01) |
| *G05B 19/042* | (2006.01) |
| *G06F 11/10* | (2006.01) |
| *H03M 13/09* | (2006.01) |

(Continued)

(52) U.S. Cl.
CPC ............ *G06F 8/65* (2013.01); *G05B 19/0426* (2013.01); *G06F 8/71* (2013.01); *G06F 11/1004* (2013.01); *H03M 13/09* (2013.01); *G05B 2219/23008* (2013.01); *H01M 2010/4271* (2013.01); *H04L 1/0061* (2013.01)

(58) Field of Classification Search
CPC ...... G06B 19/0426; G05B 2219/23008; G06F 8/65; G06F 8/71
USPC .................................................. 717/168–178
See application file for complete search history.

(56) References Cited

U.S. PATENT DOCUMENTS

| | | | | |
|---|---|---|---|---|
| 6,839,339 | B1 * | 1/2005 | Chuah .............. | H04L 29/06027 370/349 |
| 7,313,704 | B2 * | 12/2007 | Kashiwada ............... | G06F 8/65 713/191 |
| 7,512,616 | B2 * | 3/2009 | Corcoran .............. | G06F 9/4401 |

(Continued)

FOREIGN PATENT DOCUMENTS

KR      20160046418 A      4/2016

OTHER PUBLICATIONS

Wikipedia, "List of hash functions," last retrieved from https://en.wikipedia.org/wiki/List_of_hash_functions on Jul. 8, 2018. (Year: 2018).*

(Continued)

*Primary Examiner* — Andrew M. Lyons
(74) *Attorney, Agent, or Firm* — Lerner, David, Littenberg, Krumholz & Mentlik, LLP

(57) ABSTRACT

The present disclosure relates to a method of managing and updating two different versions of software, and more particularly, to an integrated management and update method of software including integrating software of a DC-DC converter and a battery management system (BMS) installed in residential Energy Storage System (ESS) to generate and manage one integrated management package, and sequentially executing a software update procedure of the DC-DC converter and the BMS in the integrated management package.

20 Claims, 4 Drawing Sheets

(51) Int. Cl.
*H01M 10/42* (2006.01)
*H04L 1/00* (2006.01)

(56) References Cited

U.S. PATENT DOCUMENTS

| | | | | |
|---|---|---|---|---|
| 7,523,452 | B1* | 4/2009 | Kamity | G06F 8/65 |
| | | | | 717/178 |
| 7,694,293 | B2* | 4/2010 | Rao | G06F 8/65 |
| | | | | 713/191 |
| 7,913,246 | B2* | 3/2011 | Hammond | G06F 8/65 |
| | | | | 340/538 |
| 8,863,114 | B2* | 10/2014 | Shah | G06F 8/60 |
| | | | | 717/175 |
| 9,411,574 | B2* | 8/2016 | Kostadinov | G06F 8/65 |
| 2003/0066062 | A1* | 4/2003 | Brannock | G06F 8/665 |
| | | | | 717/169 |
| 2004/0107237 | A1* | 6/2004 | Kashiwada | G06F 8/65 |
| | | | | 709/200 |
| 2007/0156865 | A1* | 7/2007 | Yang | G06F 8/65 |
| | | | | 709/223 |
| 2008/0256527 | A1* | 10/2008 | Lee | G06F 8/60 |
| | | | | 717/168 |
| 2009/0062062 | A1* | 3/2009 | Choi | B60K 6/543 |
| | | | | 477/5 |
| 2009/0064125 | A1* | 3/2009 | Venkatachalam | G06F 8/65 |
| | | | | 717/170 |
| 2010/0169709 | A1* | 7/2010 | Chiu | G06F 11/1004 |
| | | | | 714/16 |
| 2011/0145804 | A1* | 6/2011 | Oka | G03B 17/14 |
| | | | | 717/168 |
| 2012/0249065 | A1* | 10/2012 | Bissonette | H02J 3/381 |
| | | | | 320/109 |
| 2012/0331181 | A1* | 12/2012 | Govande | G06F 8/65 |
| | | | | 710/8 |
| 2013/0214730 | A1* | 8/2013 | Lu | H02J 7/007 |
| | | | | 320/107 |
| 2014/0033193 | A1* | 1/2014 | Palaniappan | G06F 8/65 |
| | | | | 717/173 |
| 2014/0109075 | A1* | 4/2014 | Hoffman | G06F 8/65 |
| | | | | 717/169 |
| 2014/0344797 | A1* | 11/2014 | Rajagopalan | G06F 8/654 |
| | | | | 717/169 |
| 2015/0288212 | A1* | 10/2015 | Kim | H02H 3/24 |
| | | | | 307/80 |
| 2016/0107532 | A1* | 4/2016 | Park | B60L 11/1838 |
| | | | | 701/22 |
| 2016/0202966 | A1* | 7/2016 | Vangelov | G06F 8/654 |
| | | | | 717/172 |
| 2016/0318406 | A1* | 11/2016 | Healy | B60L 15/2045 |
| 2018/0018160 | A1* | 1/2018 | Teraoka | B60R 16/02 |
| 2018/0056808 | A1* | 3/2018 | Gibson | B60L 58/22 |
| 2018/0124156 | A1* | 5/2018 | Livingston | G06F 9/44578 |
| 2018/0191866 | A1* | 7/2018 | Nakahara | B60R 16/0231 |

OTHER PUBLICATIONS

Jeong-Hyo Bae, Bai Zhiguo, Bong-Jun Koo, Hong-Ryoung Kim and Dae-Gyeong Jang, "Battery management system by using CAN communication based on DSP platform," 2013 Fifth International Conference on Ubiquitous and Future Networks (ICUFN), Da Nang, 2013, pp. 582-587. (Year: 2013).*

M. Muneeb Ur Rehman, F. Zhang, R. Zane and D. Maksimovic, "Design and control of an integrated BMS/DC-DC system for electric vehicles," 2016 IEEE 17th Workshop on Control and Modeling for Power Electronics (COMPEL), Trondheim, 2016, pp. 1-7. (Year: 2016).*

* cited by examiner

INTEGRATED MANAGEMENT AND UPDATE METHOD OF DC-DC CONVERTER AND BATTERY MANAGEMENT SYSTEM (BMS) SOFTWARE INSTALLED IN RESIDENTIAL ESS

CROSS-REFERENCE TO RELATED APPLICATION

This application claims priority to Korean Patent Application No. 10-2016-0165026 filed on Dec. 6, 2016 and all the benefits accruing therefrom under 35 U.S.C. § 119, the contents of which are incorporated by reference in their entirety.

BACKGROUND

The present disclosure relates to a method of managing and updating two different versions of software, and more particularly, to an integrated management and update method of software including integrating software of a DC-DC converter and a battery management system (BMS) installed in residential Energy Storage System (ESS) to generate and manage one integrated management package, and sequentially executing a software update procedure of the DC-DC converter and the BMS in the integrated management package.

An Energy Storage System (ESS) is a device for storing the generated electricity in a storage device such as a battery and supplying it when power is needed to improve the efficiency of power use.

The ESS stores electricity generated from renewable energy such as sunlight, wind power, and the like, or stores electricity received from a power plant in a lithium ion battery, and after storing power at nighttime when power consumption is low, allows a user to use the stored power during the day when power consumption is relatively high.

Because of this, electricity consumption can be saved and it plays an important role by saving electric bills and ensuring stable power supply in case of emergency.

The ESS includes hardware such a plurality of battery cells, a BMS for controlling the battery cells, and a DC-DC converter for transforming inputted DC voltage. Such hardware is operated under the control of software.

In such a way, software that controls operations of main devices such as a DC-DC converter, a BMS, etc. constituting the ESS is operated separately.

SUMMARY

However, in relation to a method of operating individual software for each device, since multiple software needs to be managed and individual software needs to be updated using respective tools, maintenance is difficult. Therefore, improvement is required.

In accordance with an exemplary embodiment, a method of integrating and managing software of a DC-DC converter and a battery management system (BMS) includes: an individual software header information confirmation operation of confirming header information of each control software of the DC-DC converter and the BMS; an individual software data storage operation of storing data related to the individual software; and an integrated management package generation operation of generating an integrated management package that integrates and manages individual software for controlling the DC-DC converter and the BMS.

The integrated management package generation operation may include: an integrated management package header information generation operation of integrating individual header information of the DC-DC converter and the BMS into header information to generate integrated header information; and a cyclic redundancy check (CRC) calculation operation of calculating an entire CRC value of the integrated management package.

In accordance with another exemplary embodiment, a method of integrating and updating two or more individual software includes: an integrated management package execution operation of reading an integrated management package file integrating the individual software; a CRC check operation of checking an entire CRC of the integrated management package; a header reading operation of reading header information of one of the individual software; an ID and version check operation of checking ID and version information of one of the individual software; a data reading operation of reading data of one of the individual software; an execution and termination operation of executing and terminating an update of one of the individual software; and sequentially performing the header reading, ID/version checking, data reading and updating for the remaining software of the individual software.

In accordance with yet another exemplary embodiment, a system for integrating, managing, and updating software of a DC-DC converter and a battery management system (BMS) includes: an energy storage system (ESS) including one or more battery packs; an ESS control unit including software for controlling a device mounted in the ESS; and an ESS control server configured to generate a control command and remotely control the ESS control unit, wherein the ESS includes a DC-DC converter and a BMS; the ESS control unit includes respective software of the DC-DC converter and the BMS; and the ESS control server includes a control module for integrating, managing, and updating the respective software.

The ESS control server may generate and manage an integrated management package by integrating each header information of the DC-DC converter and the BMS in header information.

The ESS control unit may receive an update control command from the ESS control server to sequentially update software of the DC-DC converter and the BMS.

The integrated management package may perform an error detection by calculating an entire cyclic redundancy check (CRC) value.

The header information may be configured including an ID, a version, and a length of the software.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Figure 1:
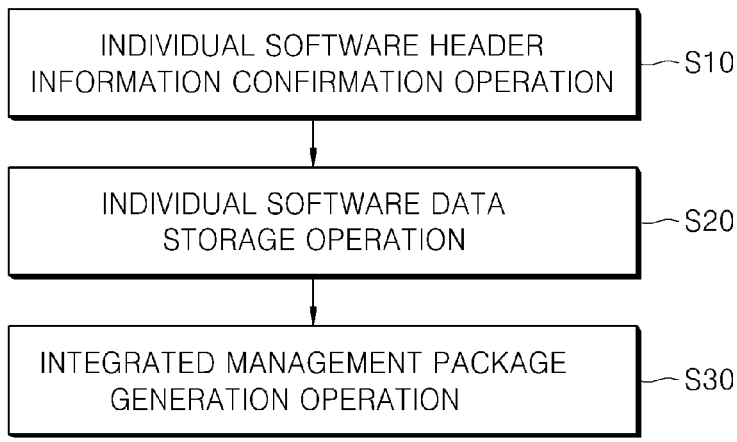
FIG. 1 is a block diagram briefly illustrating a method for integrating and managing individual software according to the present disclosure.

Hereinafter, embodiments of the present disclosure will be described in detail with reference to the accompanying drawings so that those skilled in the art can easily carry out the present disclosure. The present disclosure may, however, be embodied in different forms and should not be construed as limited to the embodiments set forth herein. Parts not relating to description are omitted in the drawings in order to clearly describe the present disclosure and like reference numerals refer to like elements throughout.

Throughout the specification, when a portion is referred to as being "connected" to another portion, it includes not only "directly connected" but also "electrically connected" with another element therebetween. Furthermore, when it is described that one "includes" some elements, it should be understood that it may include only those elements, or it may include other elements as well as those elements if there is no specific limitation. The term "~ing operation" or "operation of ~ing" used throughout the specification does not mean "operation for ~ing".

The method of integrating and managing software of a DC-DC converter and a battery management system (BMS) includes: an individual software header information confirmation operation of confirming header information of each control software of the DC-DC converter and the BMS; an individual software data storage operation of storing data related to the individual software; and an integrated management package generation operation of generating an integrated management package that integrates and manages individual software for controlling the DC-DC converter and the BMS.

Further, a method of integrating and updating two or more individual software includes: an integrated management package execution operation of reading an integrated management package file integrating the individual software; a CRC check operation of checking an entire CRC of the integrated management package; a header reading operation of reading header information of one of the individual software; an ID and version check operation of checking ID and version information of one of the individual software; a data reading operation of reading data of one of the individual software; an execution and termination operation of executing and terminating an update of one of the individual software; and sequentially performing the header reading, ID/version checking, data reading and updating for the remaining software of the individual software.

A control server of the ESS referred to in this specification may be configured separately from the ESS to remotely control the software installed in the ESS.

In addition, the integrated management package referred to in this specification may be, for example, a software file managed by one 4-byte as integrating two individual software each having a 4-byte system into one header information.

In addition, for convenience, a DC-DC transformer will be described as a 'DC-DC converter' and a battery management system will be described as a 'BMS'.

Hereinafter, the present disclosure will be described in more detail with reference to the drawings.

FIG. 1 is a block diagram briefly showing a method of integrating and managing software of a DC-DC converter and a BMS according to the present disclosure.

The method of integrating and managing software of a DC-DC converter and a BMS largely includes: an individual software header information confirmation operation (S10) of confirming header information of each control software of the DC-DC converter and the BMS; an individual software data storage operation (S20) of storing data related to the individual software; and an integrated management package generation operation (S30) of generating an integrated management package that integrates and manages individual software for controlling the DC-DC converter and the BMS.

The individual software header information confirmation operation (S10) may be an operation of confirming the header information to identify each software before integrating control software of the DC-DC converter and the BMS.

Figure 2:
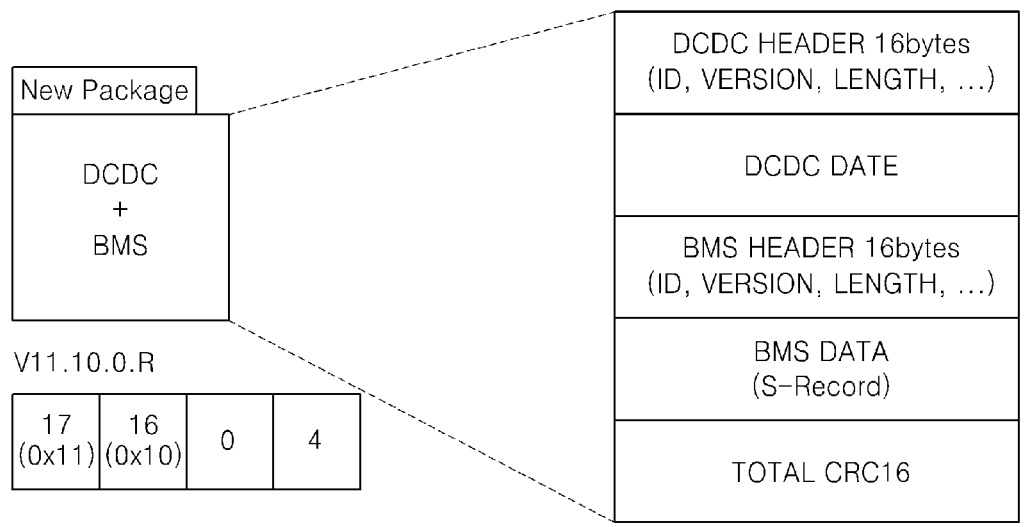
FIG. 2 is a view illustrating an embodiment of an integrated management package generation.
Figure 2:
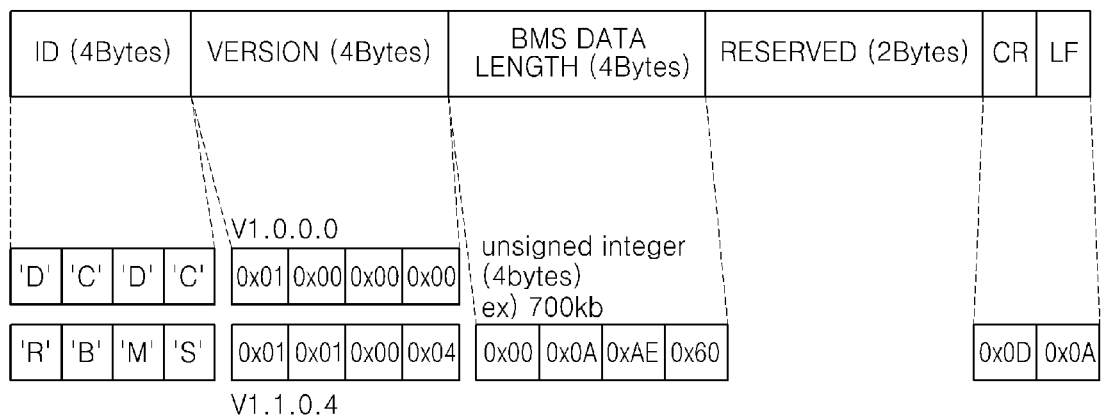

Referring to one embodiment of FIG. 2, the header information may include an ID, a version, a length, and the like of each software. Referring to FIG. 2, for example, the ID of the software for controlling the DC-DC converter is configured with 4 bytes of 'D' 'C' 'D', and 'C' and the version is configured with a version of V1.0.0.0 having respective byte values of 0x01, 0x00, 0x00, and 0x00.

The ID of the software for controlling the BMS is configured with 4 bytes of 'R' 'B' 'M', and 'S' and the version is configured with a version of V1.1.0.4 having respective byte values of 0x01, 0x01, 0x00, and 0x04.

Here, since it is difficult to configure the BMS with a 4-byte system, 'R' may be an additionally configured value only with 'B', 'M', and 'S', and may have a byte value of 0x04. Here, the software ID may mean a name, an identification number, or the like that can identify each software.

The software version may have the same meaning as the update number given at the time of updating the software, for example. Depending on the version, it is possible to identify at what time point the software is updated or to determine whether or not an update is necessary.

As described above, after confirming the header information of the individual software for controlling the DC-DC converter and the BMS, the individual software data storage operation (S20) for storing the related data of the individual software may be performed.

The individual software data storage operation (S20), as an operation of storing respective related data of the DC-DC converter and the BMS, may a preparation process for reading data of the individual software in the integrated management package in order to update an integrated management package described above.

Here, the related data of the individual software may mean all the data contained in each software including the header information of each software.

The integrated management package generation operation (S30), as an operation of integrating and managing individual software for controlling the DC-DC converter and the BMS, may be configured including an integrated management package header information generation operation (S31) of integrating individual header information of the DC-DC converter and the BMS into header information to generate integrated header information, and a CRC calculation operation (S32) of calculating an entire CRC of the integrated management package.

The integrated management package header information generation operation (S31) may be an operation of integrating each header information of the DC-DC converter and the BMS into one header information to generate integrated header information.

Referring to FIG. 2, for example, the versions 0x01, 0x00, 0x00, 0x00 of the software for controlling the DC-DC converter and the versions 0x01, 0x01, 0x00, and 0x04 of the software for controlling the BMS are integrated to generate a version of V11.10.0.R of a 4-byte system with respective byte values of 0x11, 0x10, 0, and 4.

As such, the integrated header of the integrated management package may be to integrate each of the 4-byte and 4-byte versions into one 4-byte version. Here, the software ID may mean a name, an identification number, or the like that can identify each software.

The software version may have the same meaning as the update number given at the time of updating the software, for example. Depending on the version, it is possible to identify at what time point the software is updated or to determine whether or not an update is necessary.

The CRC calculation operation (S32) may be an operation of calculating an entire CRC of the integrated management package having the integrated header information generated in the integrated management package header information generation operation (S31).

Cyclic Redundancy Check (CRC) refers to cyclic redundancy test and is a method of testing data transmission. In the process of transmitting and receiving data for integrating the individual software of the DC-DC converter and the BMS, it may be referred to as a data integrity check method that attaches a margin code to each block or frame and transmits it to check whether or not there is an error in the transmitted data, and checks if transmission contents are correct.

For example, parity is generated in the data to be transmitted and transmitted to the receiving side at the transmitting side. The receiving side checks the received parity information using the checking function, and then compares the two values to check whether or not the data is erroneous.

Figure 3:
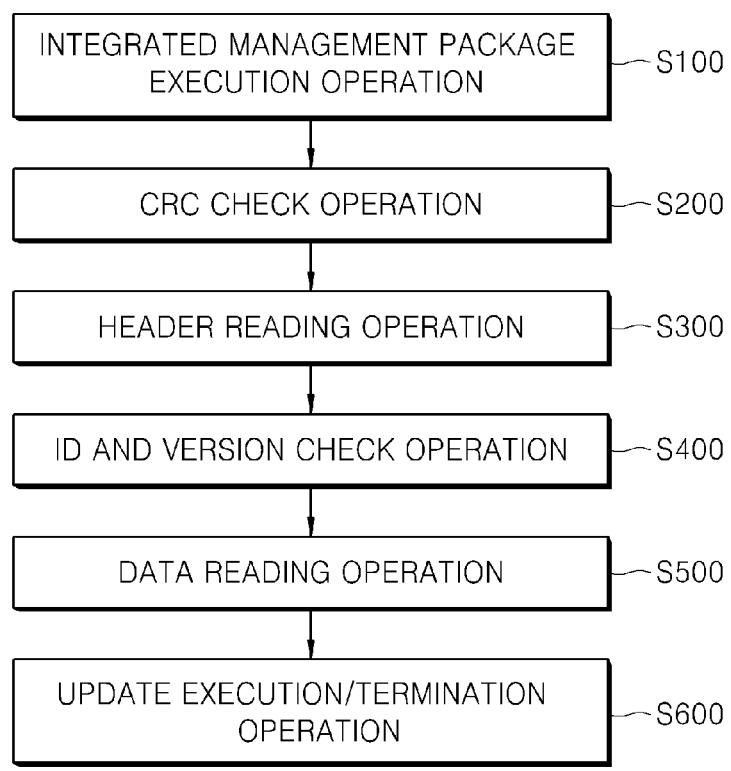
FIG. 3 is a block diagram briefly illustrating a method for updating an integrated management package according to the present disclosure.

FIG. 3 is a block diagram briefly illustrating a method for integrating and updating two or more individual software programs.

Referring to FIG. 3, a method of updating an integrated management package according to the present disclosure includes: an integrated management package execution operation (S100) of reading an integrated management package file integrating the individual software; a CRC check operation (S200) of checking an entire CRC of the integrated management package; a header reading operation (S300) of reading header information of one of the individual software; an ID and version check operation (S400) of checking ID and version information of one of the individual software; a data reading operation (S500) of reading data of one of the individual software; an execution and termination operation (S600) of executing and terminating an update of one of the individual software; and sequentially performing the header reading, ID/version checking, data reading and updating for the remaining software of the individual software.

Herein, sequentially the performing of the header reading, ID/version checking, data reading and updating for the remaining software of the individual software, for example, may be repeating S300 to S600 for the software update execution of the BMS after updating the software update of the DC-DC converter as in S100 to S600.

As such, the update of the integrated management package may include sequentially executing the individual software integrated in the integrated management package. The header information may be information including the ID, version, length, and the like of individual software. Furthermore, the software ID may mean a name, an identification number, or the like that can identify each software.

The software version may have the same meaning as the update number given at the time of updating the software, as described above. Depending on the version, it is possible to identify at what time point the software is updated or to determine whether or not an update is necessary.

The CRC check operation (S200) may be an operation of once again checking the result of the calculation of the entire CRC when integrating the individual software of the DC-DC converter and the BMS before executing the update as described with reference to FIGS. 1 and 2.

Also, it may mean that the management package is managed as one header information by integrating the individual software of the DC-DC converter and the BMS as described with reference to FIGS. 1 and 2.

Figure 4:
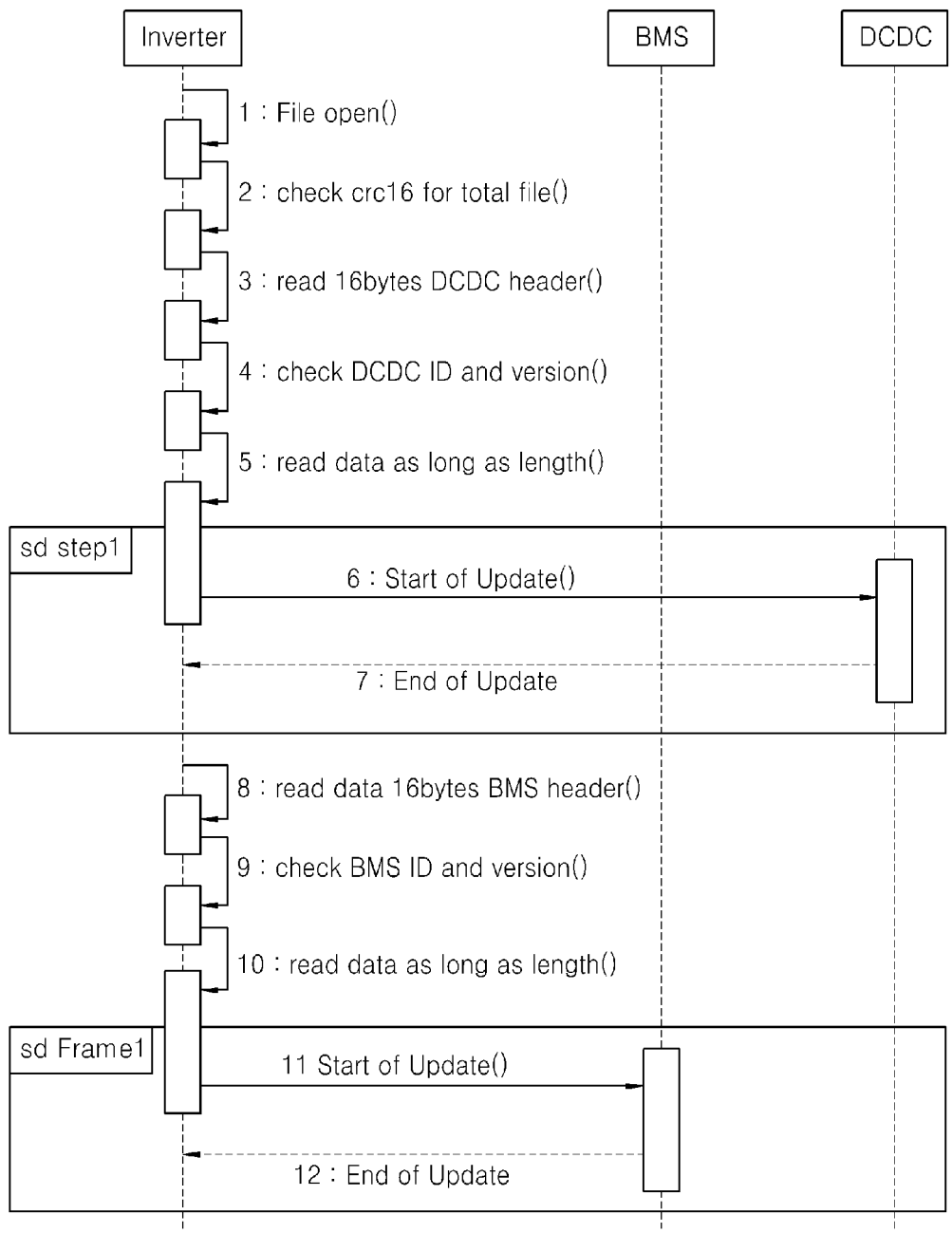
FIG. 4 is a view illustrating an embodiment of an integrated management package update.

FIG. 4 is a view showing an embodiment of an updating method according to the present disclosure. Referring to FIG. 4, for example, it is checked that the update of the integrated management package is executed through the processes of an integrated management package execution operation of reading an integrated management package file that integrates individual software, a CRC check operation of checking an entire CRC of the integrated management package, a header reading operation of reading header information of control software for controlling the DC-DC converter, an ID and version check operation of checking ID and version information of the control software for controlling the DC-DC converter, a data reading operation of reading data of the control software for controlling the DC-DC converter, an update execution operation of executing an update of the control software for controlling the DC-DC converter, an update termination operation of terminating the update of the control software for controlling the DC-DC converter, a header reading operation of reading header information of control software for controlling the BMS, and an ID and version check operation of checking the ID and version information of the control software for controlling the BMS.

First, after reading the integrated management package file from the control server 200 of the ESS and then checking the header information and the version/ID of the control software for controlling the DC transformer integrated in the integrated management package, data stored related to the control software of the DC transformer is read. Thereafter, the control server 200 remotely transmits an update control command to the control software of the DC transformer installed in the control unit 130 of the ESS to execute the update.

After terminating the update of the control software of the DC transformer, the control server 200 checks the header information and the version/ID of the control software for controlling the BMS integrated in the integrated management package, and then reads data stored in relation to the control software of the BMS. Thereafter, the control server 200 remotely transmits an update control command to the control software of the DC transformer installed in the control unit 130 of the ESS to execute the update.

Thus, in order to update each individual software, by managing individual software in a single integrated management package without using different tools and executing the update sequentially, software maintenance may be much easier. The header information may be information including the ID, version, length, and the like of individual software.

In addition, the ID of software may be the same as the name or the identification number that can identify each software as described above. The software version may be the same meaning as the update number given when the software is updated. Depending on the version, it is possible to identify at what time point the software is updated or to determine whether or not an update is necessary.

Also, reading the data related to the individual software in order to update the control software includes data related to the individual software stored when generating the integrated management package that integrates the individual software.

Figure 5:
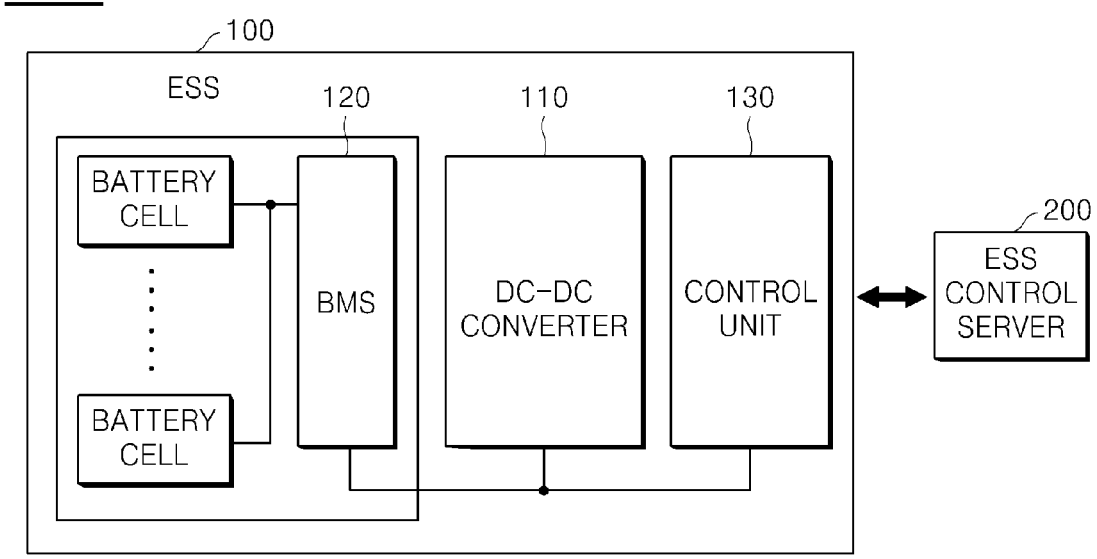
FIG. 5 is a block diagram briefly illustrating a software integrated management and update system configuration according the present disclosure.

FIG. 5 is a block diagram briefly illustrating an integrated management and update system of software according to the present disclosure. Referring to FIG. 5, a system for integrating, managing, and updating software of a DC-DC converter and a BMS includes: an ESS 100 including one or more battery packs; an ESS control unit 130 including software for controlling a device mounted in the ESS 100; and an ESS control server 200 for generating a control command and remotely controlling the ESS control unit. The ESS may include a DC-DC converter 110 and a BMS 120. The ESS control unit may include respective software of the DC-DC converter and the BMS. The ESS control server may include a control module for integrating, managing, and updating the respective software.

Here, the DC-DC converter 110 is configured to perform the DC voltage transformation and is a device for transforming an input DC into AC, and then rectifying it by raising or dropping the voltage through a transformer in order to transform the DC voltage.

The DC-DC converter 110 is equipped with hardware called a 'control board' and is configured with software for controlling the operation of the hardware. By mounting a DC-DC converter inside the ESS 100, the DC voltage can be increased in size.

The BMS 120 is connected to battery cells to monitor voltage, current, temperature, and so on and collect status information. The BMS 120 is equipped with hardware called a 'control board' and is configured with software for controlling the operation of the hardware.

The ESS control unit 130 is a configuration for mounting respective software of the DC-DC converter 110 and the BMS 120.

As described above, the DC-DC converter 110 and the BMS 120 are configured with hardware and software for controlling the hardware. In the present disclosure, the ESS control unit 130 can receive control commands from the ESS control server 200, update each software, and control operations of each DC-DC converter and BMS. The ESS control server 200 may be configured separately from the ESS (ESS) to manage and control the ESS. As described with reference to FIGS. 1 and 2, the control server 200 can generate and manage an integrated management package that integrates respective software of the DC-DC converter and the BMS.

In addition, as described with reference to FIGS. 3 and 4, the update can be performed through the integrated management package. When an update is requested, if an update control command is generated and transmitted to the ESS control unit 130, the control unit 130 can sequentially update each software of the DC-DC converter and the BMS.

In the past, there is a difficulty in maintenance by managing software provided for each device such as a DC-DC converter and a BMS by using respective tools. However, in the present disclosure, one integrated management package is generated and managed by integrating each software in the control server 200, and when software update of each device is requested, one integrated management package is controlled without having to update using different tools, and individual software integrated therein is updated sequentially, so that maintenance can be easy.

The present disclosure can achieve the effect of facilitating maintenance because software of the DC-DC converter and the BMS is integrated into one integrated management package and each device can be updated through the integrated management package.

Although the integrated management and update method of software including integrating software of a DC-DC converter and a BMS installed in residential ESS has been described with reference to the specific embodiments, it is not limited thereto. Therefore, it will be readily understood by those skilled in the art that various modifications and changes can be made thereto without departing from the spirit and scope of the present disclosure defined by the appended claims.

What is claimed is:

1. A method of integrating and managing software of a DC-DC converter and a battery management system (BMS), the method comprising:
    an individual software header information confirmation operation of confirming header information of each control software of the DC-DC converter and the BMS, each control software having respective version information;
    an individual software data storage operation of storing data related to the individual software;
    an integrated management package generation operation of generating an integrated management package that integrates and manages individual software for controlling the DC-DC converter and the BMS, wherein the management package includes the respective version information from the control software of the DC-DC converter and the BMS; and
    a control command transmission operation of transmitting a control command to a remote control unit that includes software for controlling each of the DC-DC converter and the BMS, whereby transmitting the control command causes the remote control unit to update software of each of the DC-DC converter and the BMS based on the integrated management package.

2. The method of claim 1, wherein the integrated management package generation operation comprises
    an integrated management package header information generation operation of integrating individual header information of the DC-DC converter and the BMS into header information to generate integrated header information, wherein the integrated header information includes integrated version information generated from the respective version information of the control software of the DC-DC converter and the BMS; and
    a cyclic redundancy check (CRC) calculation operation of calculating an entire CRC value of the integrated management package.

3. The method of claim 2, wherein the header information is configured including an ID, a version, and a length of the software.

4. The method of claim 2, wherein the integrated version information is equal in size to the version information of the control software of the DC-DC converter and equal in size to the version information of the control software of the BMS.

5. The method of claim 4, wherein in the control command transmission operation, transmitting the control command is based on an indication from the integrated version information that an update is necessary.

6. The method of claim 1, wherein the remote control unit that includes software for controlling each of the DC-DC converter and the BMS is further configured to control operations of the DC-DC converter and the BMS.

7. The method of claim 1, wherein transmitting the control command causes the remote control unit to perform:
a first execution operation for updating software of one of the DC-DC converter or the BMS based on the integrated management package using an update tool;
a termination operation for terminating of the first execution operation; and
after the termination operation, a second execution operation for updating software of the other of the DC-DC converter or the BMS based on the integrated management package using the same update tool as the first execution operation.

8. A method of integrating and updating two or more individual software, the method comprising:
an integrated management package execution operation of reading an integrated management package file integrating the individual software;
a CRC check operation of checking a CRC of the entire integrated management package;
a header reading operation of reading header information of one of the individual software, the header information stored in the integrated management package file;
an ID and version check operation of checking ID and version information of one of the individual software, the ID and version information included in the header information stored in the integrated management package file;
a data reading operation of reading data of one of the individual software stored in the integrated management package file;
an execution and termination operation of executing and terminating an update of one of the individual software; and
sequentially performing the header reading, ID/version checking, data reading and updating for the remaining software of the individual software.

9. The method of claim 8, wherein the header information is configured including an ID, a version, and a length of the software.

10. The method of claim 8, wherein the individual software control operations of respective hardware in one-to-one correspondence.

11. The method of claim 10, wherein one individual software controls operation of a first hardware configured to perform DC voltage transformation from an input DC into AC, and wherein another individual software controls operation of a second hardware configured to monitor at least one of voltage, current, or temperature of a plurality of battery cells.

12. A system for integrating, managing, and updating software of a DC-DC converter and a battery management system (BMS), the system comprising:
an energy storage system (ESS) including:
a DC-DC converter;
a BMS;
one or more battery packs; and
an ESS control unit including software for controlling each of the DC-DC converter and the BMS; and
an ESS control server configured to generate control commands and remotely control the ESS control unit;
wherein the ESS control unit comprises respective software for controlling the DC-DC converter and the BMS, each of said software having respective version information;
wherein the ESS control server comprises a control module for integrating, managing, and updating the respective software, wherein the control module is configured to generate an integrated management package that integrates the respective software of the DC-DC converter and the BMS, and includes the respective version information of said software; and
wherein the ESS control unit is configured to update software of the DC-DC converter and the BMS in accordance with a control command generated by the ESS control server based on the integrated management package.

13. The system of claim 12, wherein the version information is included in header information of each of the respective software of the DC-DC converter and the BMS, wherein the ESS control server generates and manages an integrated management package by integrating each header information of the DC-DC converter and the BMS in header information, and wherein the integrated header information includes integrated version information generated from the respective version information of the header information of the DC-DC converter and the BMS.

14. The system of claim 12, wherein the ESS control unit receives an update control command from the ESS control server to sequentially update software of the DC-DC converter and the BMS.

15. The system of claim 13, wherein the integrated management package performs an error detection by calculating an entire cyclic redundancy check (CRC) value.

16. The system of claim 13, wherein the header information is configured including an ID, a version, and a length of the software.

17. The system of claim 13, wherein the integrated version information is equal in size to the version information of the control software of the DC-DC converter and equal in size to the version information of the control software of the BMS.

18. The method of claim 17, wherein in the control command transmission operation, transmitting the control command is based on an indication from the integrated version information that an update is necessary.

19. The system of claim 12, wherein the ESS control unit is further configured to control operations of the DC-DC converter and the BMS.

20. The system of claim 12, wherein the ESS control unit is configured to update software of the DC-DC converter and the BMS by performing:
a first execution operation for updating software of one of the DC-DC converter or the BMS based on the integrated management package using an update tool;
a termination operation for terminating of the first execution operation; and
after the termination operation, a second execution operation for updating software of the other of the DC-DC converter or the BMS based on the integrated management package using the same update tool as the first execution operation.

* * * * *